(12) United States Patent
Hsieh et al.

(10) Patent No.: US 11,206,495 B2
(45) Date of Patent: Dec. 21, 2021

(54) STRUCTURE OF MICRO-ELECTRO-MECHANICAL-SYSTEM MICROPHONE

(71) Applicant: Solid State System Co., Ltd., Hsinchu (TW)

(72) Inventors: Tsung-Min Hsieh, New Taipei (TW); Li-Chi Tsao, Taichung (TW); Chien-Hsing Lee, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 216 days.

(21) Appl. No.: 16/677,622

(22) Filed: Nov. 7, 2019

(65) Prior Publication Data
US 2021/0144485 A1 May 13, 2021

(51) Int. Cl.
*H04R 19/00* (2006.01)
*H04R 19/04* (2006.01)
(Continued)

(52) U.S. Cl.
CPC ............. *H04R 19/04* (2013.01); *B81B 3/001* (2013.01); *B81B 3/0021* (2013.01); *B81C 1/00158* (2013.01); *H04R 7/04* (2013.01); *H04R 7/18* (2013.01); *H04R 19/005* (2013.01); *B81B 2201/0257* (2013.01);
(Continued)

(58) Field of Classification Search
CPC . H04R 19/04; H04R 7/04; H04R 7/18; H04R 19/005; H04R 2410/03; H04R 2201/003; H04R 31/003; B81C 2201/0109; B81C 1/00158; B81B 2201/0257;
(Continued)

(56) References Cited

U.S. PATENT DOCUMENTS

| 2018/0077499 A1* | 3/2018 | Yoo | B81B 3/0075 |
| 2018/0115836 A1* | 4/2018 | Hsieh | H04R 31/003 |
| 2020/0024134 A1* | 1/2020 | Jenkins | H04R 19/005 |

FOREIGN PATENT DOCUMENTS

| CN | 103369441 | 10/2013 |
| CN | 104254046 | 2/2018 |
| CN | 107872760 | 4/2018 |

OTHER PUBLICATIONS

"Office Action of Taiwan Counterpart Application", dated Jan. 25, 2021, p. 1-p. 6.

\* cited by examiner

*Primary Examiner* — Matthew A Eason
(74) *Attorney, Agent, or Firm* — JCIPRNET

(57) ABSTRACT

A MEMS microphone includes a substrate. A dielectric layer is disposed on the substrate, having an opening and includes: indent region surrounding the opening; pillars extending from an indent surface at the indent region to the substrate; and an outer part surrounding the indent region and disposed on the substrate. A signal sensing space is created at the indent region between the pillars and between the pillars and the outer part. A first electrode layer is disposed on the indent surface of the dielectric layer. A second electrode layer is disposed on the substrate. A sensing diaphragm is held by the dielectric layer, including two elastic diaphragms supported by the dielectric layer; and a conductive plate between the first elastic diaphragm and the second elastic diaphragm. The conductive plate has a central part embedded in the holding structure and a peripheral part extending into the signal sensing space.

26 Claims, 21 Drawing Sheets

(51) Int. Cl.
    *B81B 3/00*      (2006.01)
    *B81C 1/00*      (2006.01)
    *H04R 7/04*      (2006.01)
    *H04R 7/18*      (2006.01)
(52) U.S. Cl.
    CPC ... *B81B 2203/0127* (2013.01); *B81B 2203/04* (2013.01); *B81C 2201/0109* (2013.01); *H04R 2201/003* (2013.01); *H04R 2410/03* (2013.01)
(58) Field of Classification Search
    CPC ........ B81B 2203/04; B81B 2203/0127; B81B 2201/0109; B81B 3/001; B81B 3/0021
    See application file for complete search history.

STRUCTURE OF MICRO-ELECTRO-MECHANICAL-SYSTEM MICROPHONE

BACKGROUND

1. Field of the Invention

The invention is related to MEMS (Micro Electro Mechanical System) microphone package technology, and particularly related to the structure of MEMS microphone.

2. Description of Related Art

Microphone has been designed based on semiconductor fabrication technology, so as to greatly reduce the size. The MEMS microphone is a popular device used in electronic apparatus to sense acoustic signals, such as the communication voice.

The function of the MEMS microphone to sense the acoustic signal is based on a diaphragm, which is responding to the air pressure from the acoustic signal with a frequency, so to vibrate corresponding to the frequency and amplitude of the acoustic signal. The acoustic signal is then converted into electric signal for subsequent application in peripheral electronic apparatus.

The performance of the diaphragm as an essential factor to determine the performance of the MEMS microphone. However, conventionally, the thermal noise from the air to transmit the acoustic signal through the microstructure is usually involved in detection. The thermal noise N is usually containing a factor of $\sqrt{4\pi kRT}$, in which the parameter T is the ambient temperature, not a constant. The thermal noise may reduce the signal-noise ratio (SNR) of the MEMS microphone. In an example, the sources of thermal noise for capacitive MEMS microphone are from the thermal air flowing through the vent holes and the gap between the membrane and backplate due to high acoustic resistance in such regions. A case of high thermal noise may reduce the SNR of MEMS microphone.

How to design diaphragm of the MEMS microphone is still under developing in the art.

SUMMARY OF THE INVENTION

The invention provides a structure of MEMS microphone. The MEMS microphone needs no back plate with venting holes. The sensing diaphragm may sense the air pressure from acoustic signal to induce vibration, in which a ground plate is driven simultaneously. The capacitor involving the ground plate is formed in the dielectric layer. The capacitor is formed in the hermetic space with a reduced pressure less than the ambient pressure, which is a medium to transmit the acoustic signal. The MEMS microphone of the invention in an embodiment needs no the back plate with the venting holes. The thermal noise of the sensing capacitor in the hermetic space with reduced pressure may be reduced.

In an embodiment, the invention provides a structure of MEMS microphone. The MEMS microphone comprises a substrate of semiconductor, having a first opening in the substrate. A dielectric layer is disposed on the substrate, wherein the dielectric layer has a second opening corresponding to the first opening. The dielectric layer includes an indent region with respect to the substrate, surrounding the second opening. A plurality of pillars is extending from an indent surface at the indent region to the substrate. An outer part is surrounding the indent region and disposed on the substrate. A signal sensing space is created at the indent region between the pillars and between the pillars and the outer part. A first electrode layer is supported on the indent surface of the dielectric layer. A second electrode layer is supported on the substrate. A sensing diaphragm is held by the dielectric layer, comprising a first elastic diaphragm, supported by the dielectric layer at a first side region. A second elastic diaphragm is supported by the substrate at a second side region. A holding structure is between the first elastic diaphragm and the second elastic diaphragm. A conductive plate is between the first elastic diaphragm and the second elastic diaphragm. The conductive plate comprises a central part embedded in the holding structure and a peripheral part extending into the signal sensing space.

In an embodiment, the invention also provides structure of MEMS microphone. The MEMS microphone comprises a substrate of semiconductor, having a first opening in the substrate. A dielectric layer is disposed on the substrate. The dielectric layer has a second opening corresponding to the first opening. The dielectric layer includes an indent region with respect to the substrate, surrounding the second opening. A plurality of pillars is extending from an indent surface at the indent region to the substrate. An outer part is surrounding the indent region and disposed on the substrate. A signal sensing space is created at the indent region between the pillars and between the pillars and the outer part. A first electrode layer is supported on the indent surface of the dielectric layer. A second electrode layer is supported on the substrate. A sensing diaphragm is held by the dielectric layer, comprising a first elastic ring layer, supported by the dielectric layer at a first side region. A second elastic ring layer is supported by the substrate at a second side region. A vertical ring is joining the first elastic ring diaphragm and the second elastic ring diaphragm at an inner side. A conductive plate is affixed to the sidewall, disposing between the first elastic diaphragm and the second elastic diaphragm, and extending into the signal sensing space. A hard diaphragm is affixed to the side wall within the vertical ring. The conductive plate shifts together with the hard diaphragm are affixed as a whole to shift together.

In an embodiment, the invention also provides structure of MEMS microphone. The MEMS microphone comprises a substrate of semiconductor, having a first opening in the substrate. A dielectric layer disposed on the substrate, wherein the dielectric layer has a second opening corresponding to the first opening, the dielectric layer includes an indent region with respect to the substrate, surrounding the second opening. A first electrode layer is supported on the indent surface of the dielectric layer. A second electrode layer is supported on the substrate. A sensing diaphragm held by the dielectric layer comprises an elastic portion held between the dielectric layer at the indent region and the substrate. A central hard region receives an air acoustic pressure and according shifts in responding to the acoustic pressure. An electrode portion is affixed to the central hard region and extending into the signal sensing space between the first electrode layer and the second electrode layer. The electrode portion and the central hard region shift together.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to a structure of MEMS microphone. The MEMS microphone needs no back plate with venting holes. The sensing diaphragm may directly sense the air pressure from acoustic signal to induce vibration, in which a conductive plate serving as a ground plate is driven simultaneously. The capacitor involving the conductive plate is formed inside the dielectric layer at an indent region. The MEMS microphone of the invention then needs no back plate with the venting holes. The indent region at the end is a sealed space with a reduced pressure than the ambient pressure. The sensing capacitor is formed inside the sealed space with reduced pressure. In this indent region, the amount of air flow on the capacitor is reduced, and thermal noise may be reduced.

Several embodiments are provided for describing the invention. However, the invention is not limited to the embodiments as provided. In addition, a combination may also be made between the embodiments.

Figure 1:
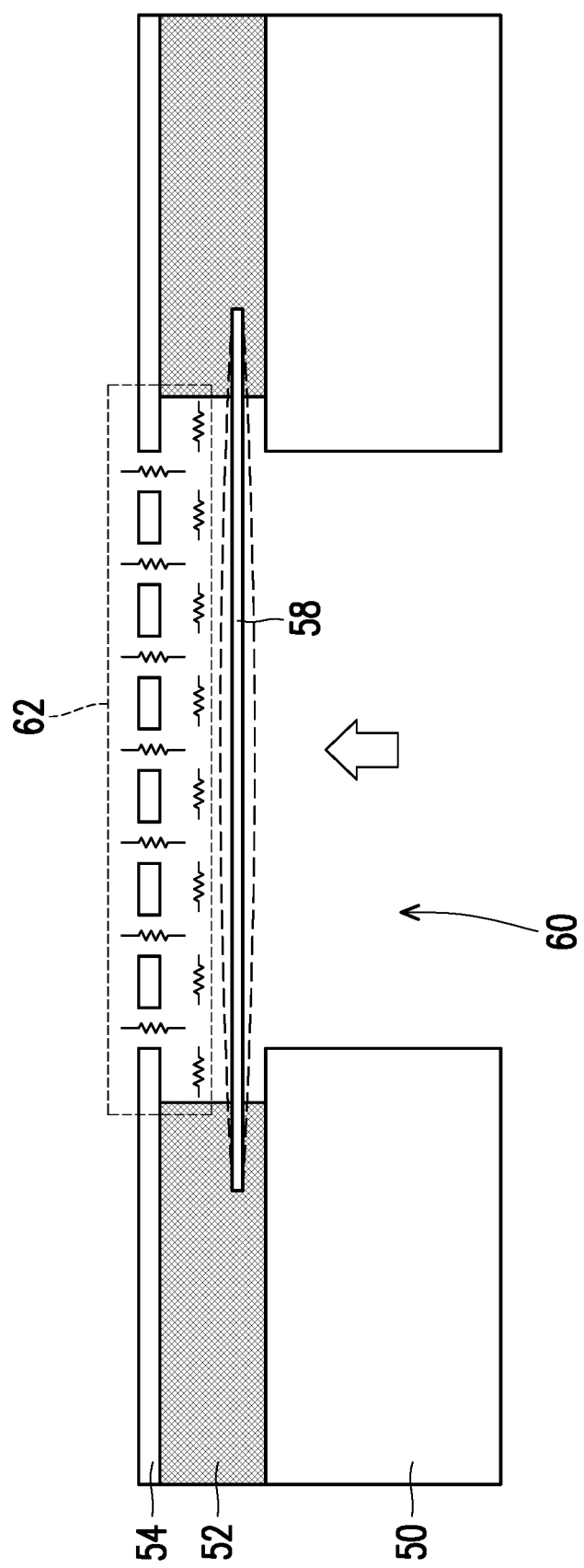
FIG. 1 is a drawing, schematically illustrating a cross-sectional view of a structure of MEMS microphone as looked into, according to an embodiment of the invention.

FIG. 1 is a drawing, schematically illustrating a cross-sectional view of a structure of MEMS microphone as looked into, according to an embodiment of the invention. Referring to FIG. 1, the MEMS microphone designed with back plate and venting holes is looked into. As to a usual MEMS microphone, a substrate 50 of silicon is provided as a structure base. The substrate 50 has an opening 60 serving as a cavity in the MEMS microphone. A dielectric layer 52 is disposed on the substrate 50. The dielectric layer 52 also has an opening corresponding to the opening 60 in the substrate 50 so to hold a diaphragm 58 within the opening. A back plate 54 within venting holes. The diaphragm 58 responds to the acoustic signal to vibrate, causing the variance of capacitance between the back plate 54 and the diaphragm 58. The air is the acoustic medium to transmit the acoustic signal, in which the acoustic resistance exists. The thermal noise from the air during transmitting the acoustic signal is usually involved in the detection. The thermal noise N is usually proportional to a factor of $\sqrt{4\pi kRT}$, in which the ambient temperature T of the ambient air would affect the detection.

Figure 2:
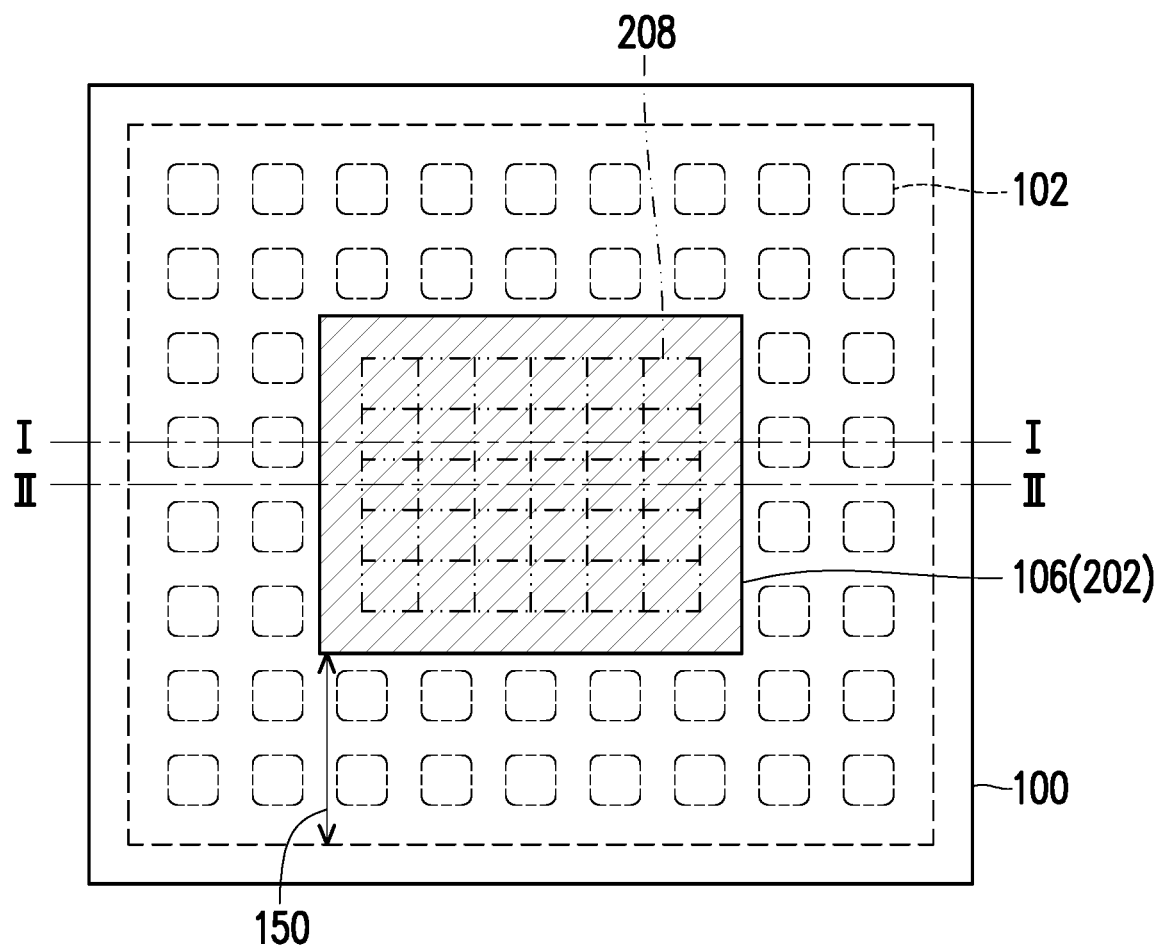
FIG. 2 is a drawing, schematically illustrating a perspective top view of the MEMS microphone, according to an embodiment of the invention.
Figure 3:
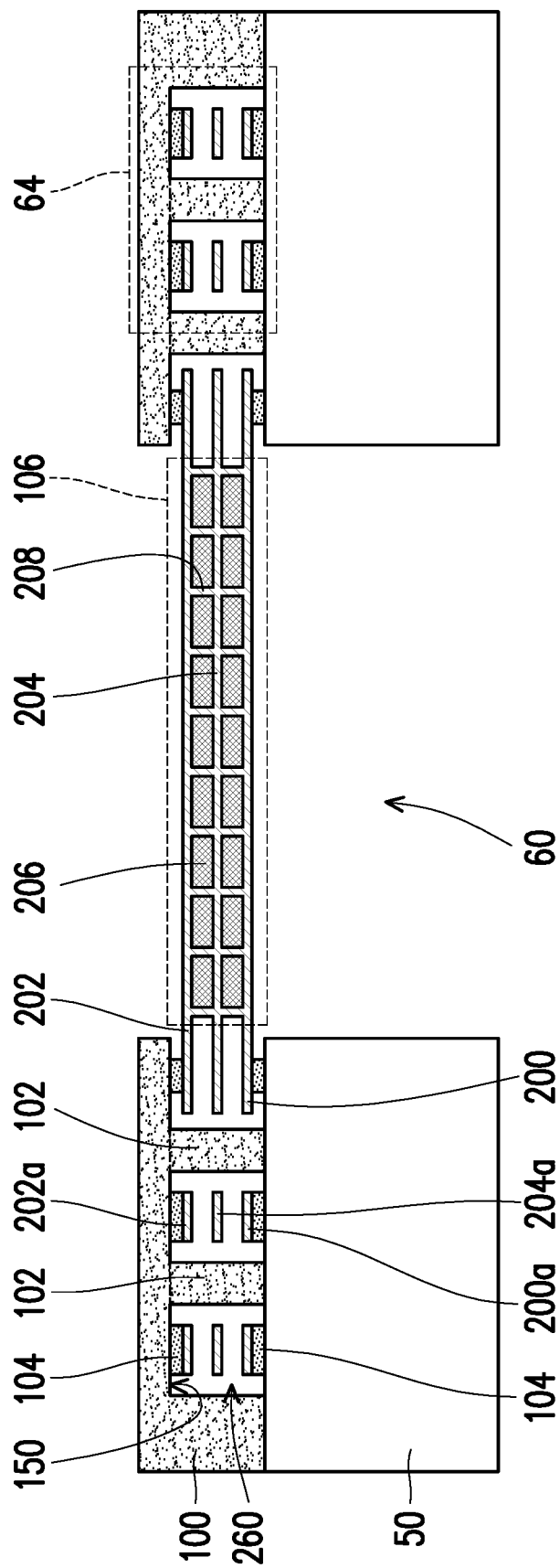
FIG. 3 is a drawing, schematically illustrating a cross-sectional view of a MEMS microphone on a cut line I-I in FIG. 2, according to an embodiment of the invention.
Figure 4:
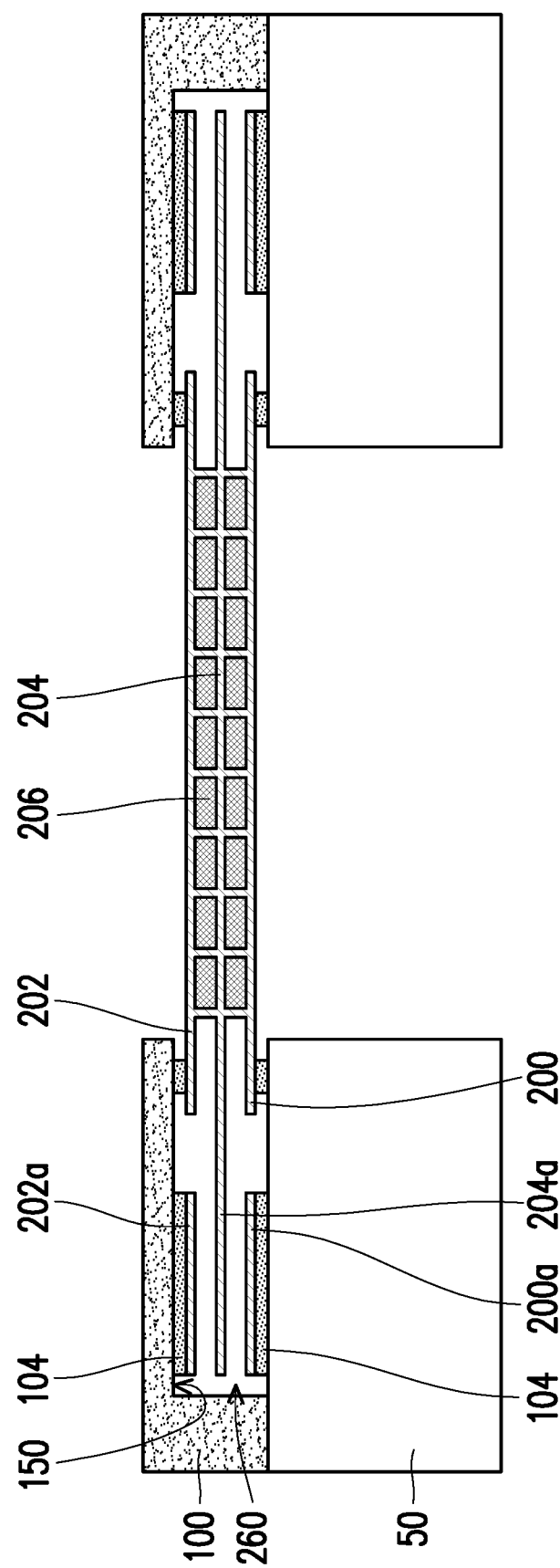
FIG. 4 is a drawing, schematically illustrating a cross-sectional view of a MEMS microphone on a cut line II-II in FIG. 2, according to an embodiment of the invention.

In an embodiment, a MEMS microphone is further proposed without involving the back plate. The thermal noise on the sensing capacitor may be reduced. FIG. 2 is a drawing, schematically illustrating a perspective top view of the MEMS microphone, according to an embodiment of the invention. FIG. 3 is a drawing, schematically illustrating a cross-sectional view of a MEMS microphone on a cut line I-I in FIG. 2, according to an embodiment of the invention. FIG. 4 is a drawing, schematically illustrating a cross-sectional view of a MEMS microphone on a cut line II-II in FIG. 2, according to an embodiment of the invention.

Referring to FIG. 3 and FIG. 4 with FIG. 2, the dielectric layer 100 is disposed on the substrate 50, which has an opening 60. The dielectric layer 100 also has an opening, corresponding to the opening 60 of the substrate 50 to form the detection space of acoustic signal. The dielectric layer 100 has an indent region 150, surrounding the opening 60. The sensing diaphragm 106 includes an elastic diaphragm 200 is at the lower part as held by the substrate 50. Another elastic diaphragm 202 is at the upper part as held by the dielectric layer 100 on the indent surface of the indent region 50. The elastic diaphragms 200, 202 are shifted up and down in responses the air pressure from the acoustic signal. The sensing diaphragm 106 also includes a conductive plate 204 firmly held between the elastic diaphragms 200 and the elastic diaphragms 202.

In an embodiment, a holding structure is implemented between the elastic diaphragm 200 and the elastic diaphragm 202 to firmly hold the conductive plate 204. The elastic diaphragm 200 and the elastic diaphragm 202 at the end part held by the substrate 50 and the dielectric layer 100 would vibrate up and down in response to the frequency and amplitude of the acoustic signal and then drive the conductive plate 204 to up and down accordingly.

In an embodiment, the holding structure between the elastic diaphragm 200 and the elastic diaphragm 202 may include a dielectric material 206 to hold the conductive plate 204. To have the firm structure of the sensing diaphragm 106, a plurality of support walls 208 is also perpendicularly implemented to hold the elastic diaphragm 200, the conductive plate 204, and the elastic diaphragm 202. Depending on the geometric shape of the sensing diaphragm 106, the support walls 208 may be grid structure as viewed from top. However, the support walls 208 may be implemented according to the actual design without being limited to the embodiment. The outmost support walls would enclose the dielectric material 206. As a result, the peripheral part of the elastic diaphragm 200 and the elastic diaphragm 202 remains elastic and the central part with the holding structure becomes a firm part to sensing the acoustic signal. The elastic periphery region of the sensing diaphragm 106 allows the sensing diaphragm 106 to vibrate up and down.

The mechanism to form the capacitor in response to the acoustic signal is further described. In an embodiment, the conductive plate 204 has a peripheral part 204a, which is extending into the indent region 150 of the dielectric layer 100 as seen in better detail in FIG. 3 and FIG. 4. The indent region 150 of the dielectric layer 100 forms a signal sensing space 260. However, to have sufficient mechanical strength to maintain the dielectric layer 100 at the indent region 150, a plurality of pillars, 102 is formed, extending from an indent surface at the indent region 150 to the substrate 50. The dielectric layer 100 at indent region 150 would not collapse. The pillars are distributed in the indent region 150, surrounding the opening 60. The dielectric layer 100 has an outer part as the main body to be disposed on the substrate 50 and surround the indent region 150. The signal sensing space 260 is created at the indent region 150 between the pillars 102, and between the pillars 102 and the outer part of the dielectric layer 100.

The signal sensing space 260 is hermetic and the air pressure in this signal sensing space 260 may be less than the ambient pressure, so to reduce noise from the air resistance on the sending capacitor as formed. The outmost support wall 208 with the support layer 104 form the hermetic space.

An electrode layer 200a is disposed on the substrate 50. Here in an embodiment, the electrode layer 200a may be an extending part of the elastic diaphragm 200 to reduce fabrication complexity. The elastic diaphragm 200 is metal to also serve as the electrode layer 200a. However, the electrode layer 200a in an embodiment may be a conductive material different from the elastic diaphragm 200. Likewise, an electrode layer 202a is disposed on the dielectric layer 100 at the indent region 150. The electrode layer 202a may be an extending part of the elastic diaphragm 202 to reduce fabrication complexity. The elastic diaphragm 202 is metal to also serve as the electrode layer 202a. However, the electrode layer 202a in an embodiment may be a conductive material different from the elastic diaphragm 202. A support layer 104 may be used to additionally support the electrode layer 200a and the electrode layer 202a, and also support the two elastic diaphragms 200, 202 at the peripheral part.

The peripheral part 204a of the conductive plate 204 between the two electrode layers 200a, 202a form two capacitors coupled in series. As to be described later in detail, the peripheral part 204a of the conductive plate 204 is shifted up and down as a vibration with the frequency and amplitude of the acoustic signal. The variance of the capacitance as detected is converted into the electric signal of the acoustic signal for external electronic circuit in various applications.

As noted, the cross-sectional structure in FIG. 3 would cross the pillars 102 of the dielectric layer 100. However, the cross-sectional structure in FIG. 3 would not cross the pillars 102 of the dielectric layer 100. Then, no pillar is shown. The signal sensing space 260 are distributed over the whole indent region 150 of the dielectric layer 100.

Figure 5:
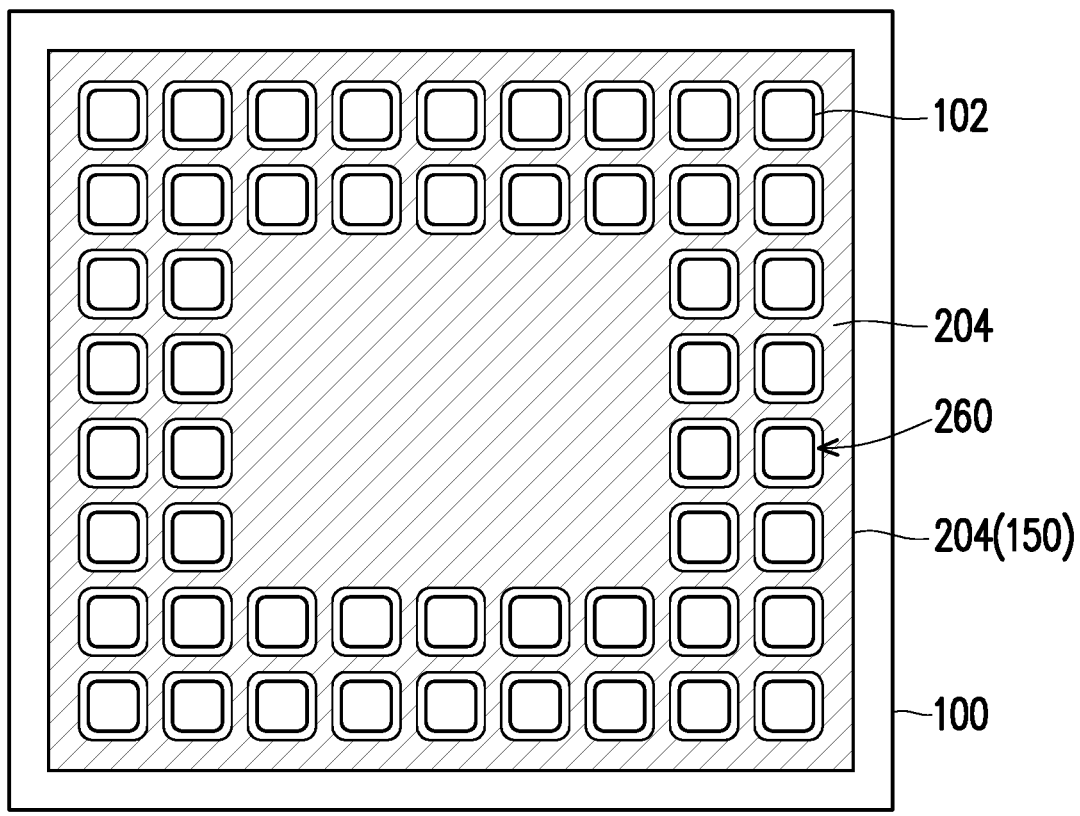
FIG. 5 is a drawing, schematically illustrating a plane view of a dielectric layer of the MEMS microphone, according to an embodiment of the invention.

FIG. 5 is a drawing, schematically illustrating a plane view of a dielectric layer of the MEMS microphone, according to an embodiment of the invention. Referring to FIG. 5, the plane view of the conductive plate 204 in relating to the dielectric layer 100 is shown in detail. The peripheral part of the conductive plate 204 is extending into the indent region 150 of the dielectric layer 100. The indent region 150 has the pillars 102 as shown when cutting at the plane of the conductive plate 204. The signal sensing space 260 surrounds the pillars 102. In other words, the pillars are penetrating through conductive plate 204 at the peripheral part. The central part of the conductive plate 204 is held by the holding structure between the two elastic diaphragms 200, 202 as seen in FIG. 3.

Figure 6:
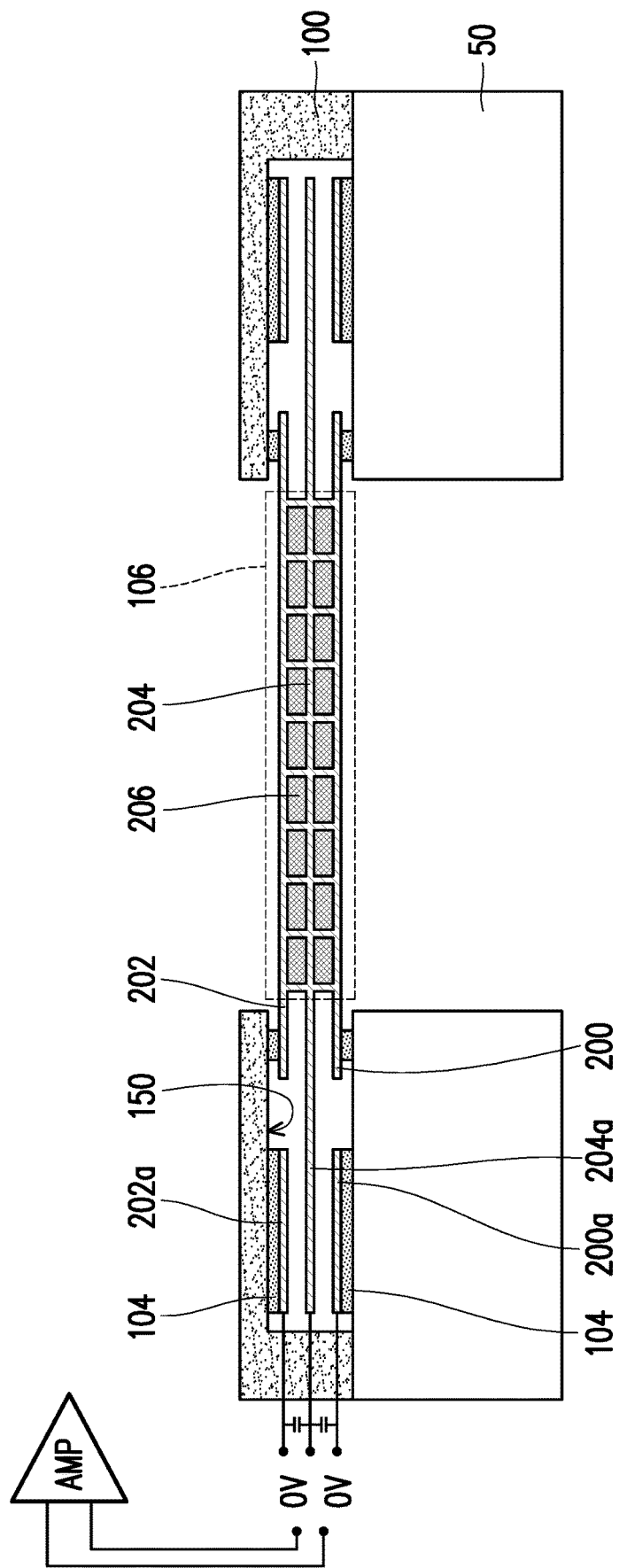
FIG. 6 is a drawing, schematically illustrating a cross-sectional view of the MEMS microphone in operation at idle state, according to an embodiment of the invention.

FIG. 6 is a drawing, schematically illustrating a cross-sectional view of the MEMS microphone in operation at idle state, according to an embodiment of the invention. Referring to FIG. 6, the peripheral part 204a of the conductive plate 204 is located between the two electrode layers 200a, 202a within the signal sensing space 260. In electronic detection mechanism, the conductive plate 204 in an embodiment is applied with a common voltage while the electrode layer 200a is applied with a voltage and the electrode layer 202a is applied with another voltage. The electrode layer 200a and the elastic diaphragm 200 may be fabricated from the same preliminary layer in an embodiment, but the electrode layer 200a and the elastic diaphragm 200 are electric separated. The electrode layer 202a and the elastic diaphragm 202 are also electric separated. When no acoustic signal or no air pressure is applied to the sensing diaphragm 106, no voltage variance is detected by the sense amplifier.

Figure 7:
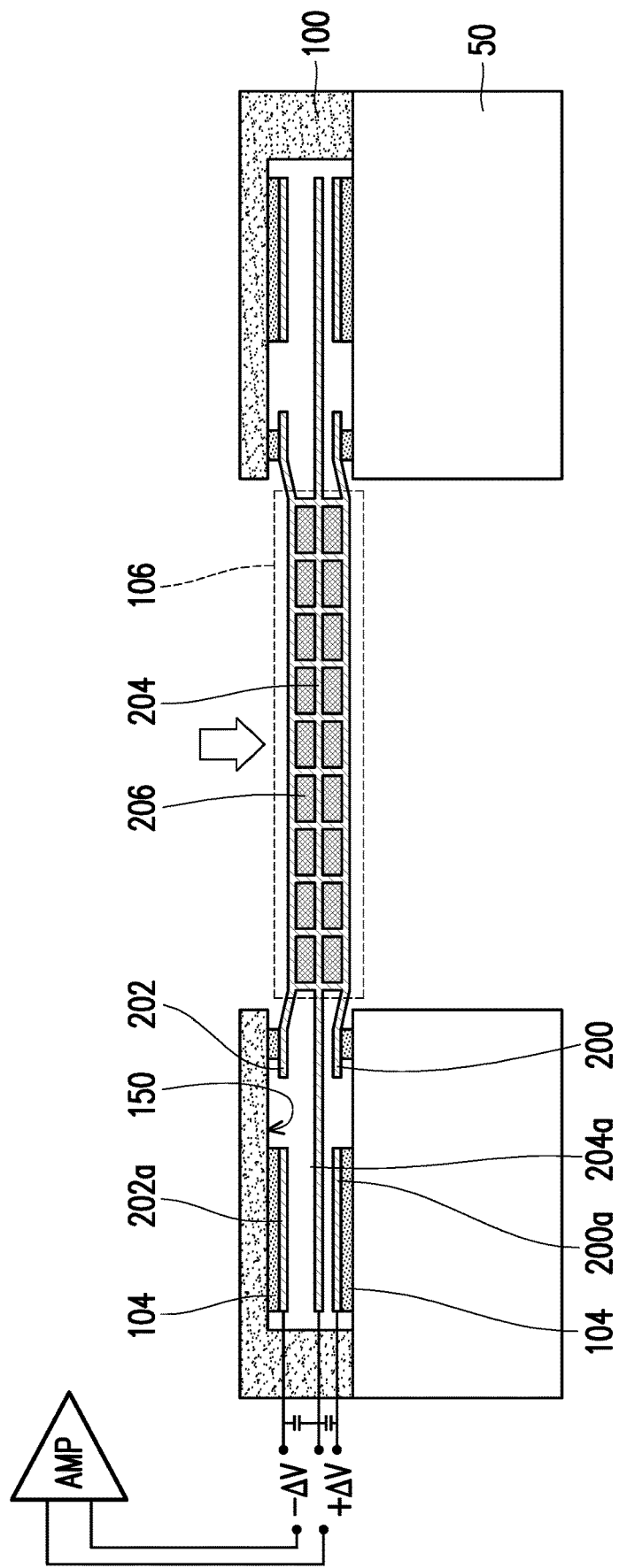
FIG. 7 is a drawing, schematically illustrating a cross-sectional view of the MEMS microphone in operation at sensing state, according to an embodiment of the invention.

FIG. 7 is a drawing, schematically illustrating a cross-sectional view of the MEMS microphone in operation at sensing state, according to an embodiment of the invention. Referring to FIG. 7, when a downward air pressure from the acoustic signal is applied to the sensing diaphragm 106, the peripheral part 204a of the conductive plate 204 is driven down, being more closing to the electrode layer 200a. The voltage variance is then detected.

Figure 8:
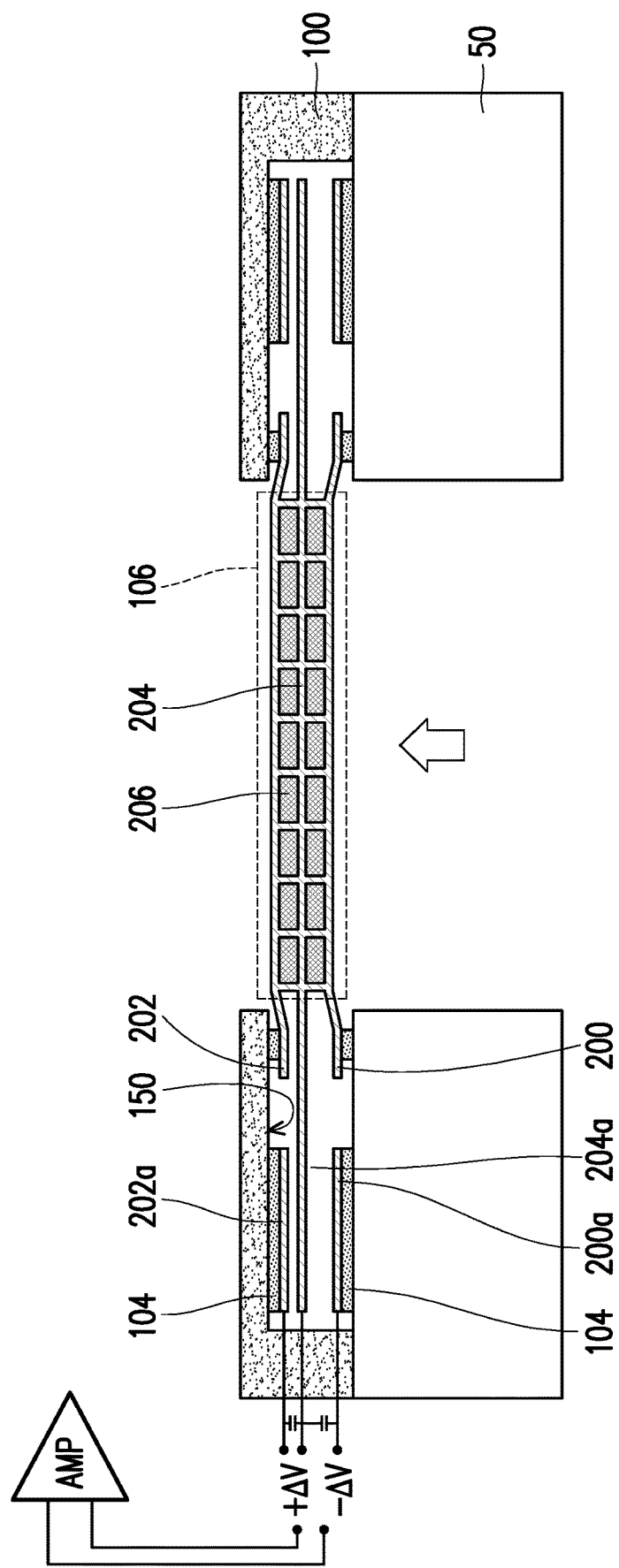
FIG. 8 is a drawing, schematically illustrating a cross-sectional view of the MEMS microphone in operation at sensing state, according to an embodiment of the invention.

FIG. 8 is a drawing, schematically illustrating a cross-sectional view of the MEMS microphone in operation at sensing state, according to an embodiment of the invention. Referring to FIG. 8, when an upward air pressure from the acoustic signal is applied to the sensing diaphragm 106, the peripheral part 204a of the conductive plate 204 is driven up, being more closing to the electrode layer 202a. The voltage variance is then detected in an opposite sign to the signal in FIG. 7.

As noted in FIG. 7 and FIG. 8, the electric signal as detected is corresponding to the acoustic signal. However, the two capacitors are formed in a hermetic signal sensing space 260. In an embodiment, the thermal noise on the sensing capacitor in the hermetic sensing space 260 with reduced pressure may be reduced. There is no further need in the invention about the back plate with electrode layer and venting holes.

Figure 9:
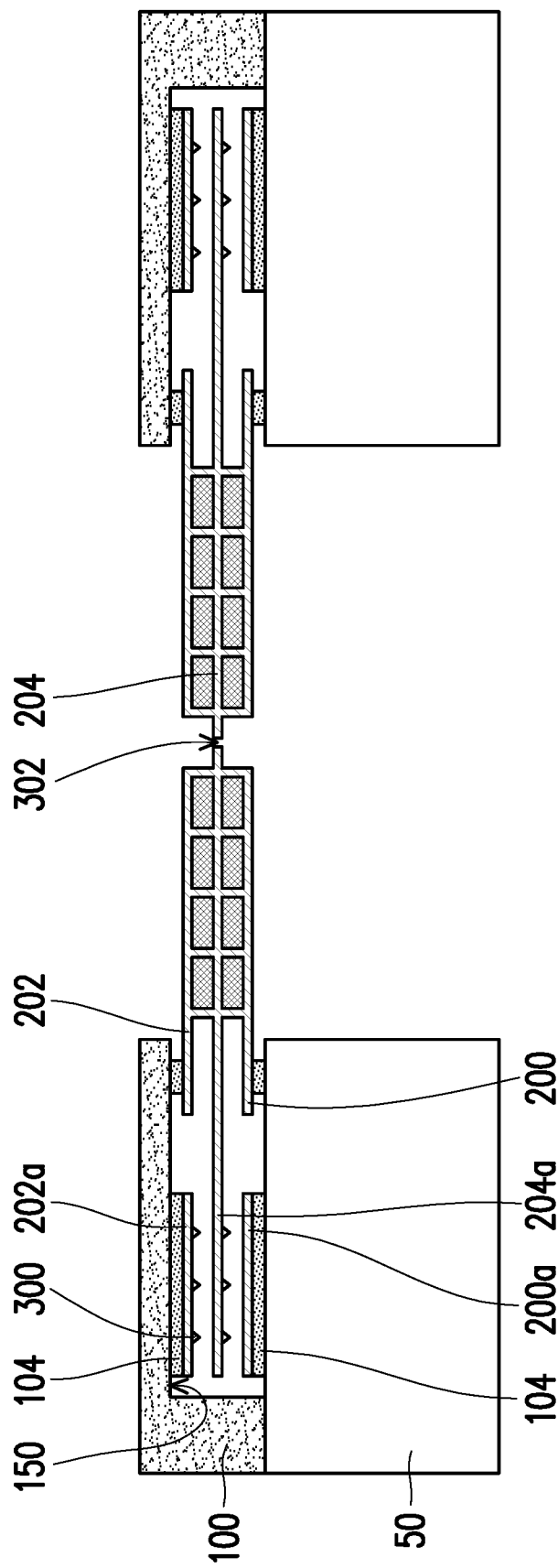
FIG. 9 is a drawing, schematically illustrating a cross-sectional view of the MEMS microphone, according to an embodiment of the invention.

In another aspect, the sensing diaphragm 106 may be further modified. FIG. 9 is a drawing, schematically illustrating a cross-sectional view of the MEMS microphone, according to an embodiment of the invention. Referring to FIG. 9, the sensing diaphragm may additionally have a balance hole 302, so that a pressure balance at two sides may be improved. In addition, the anti-stiction structures 300 may be formed on the electrode layer 200a, 202a and/or the conductive plate 204 to avoid stiction occurring between the electrode layer 200a, 202a and the conductive plate 204.

Figure 10:
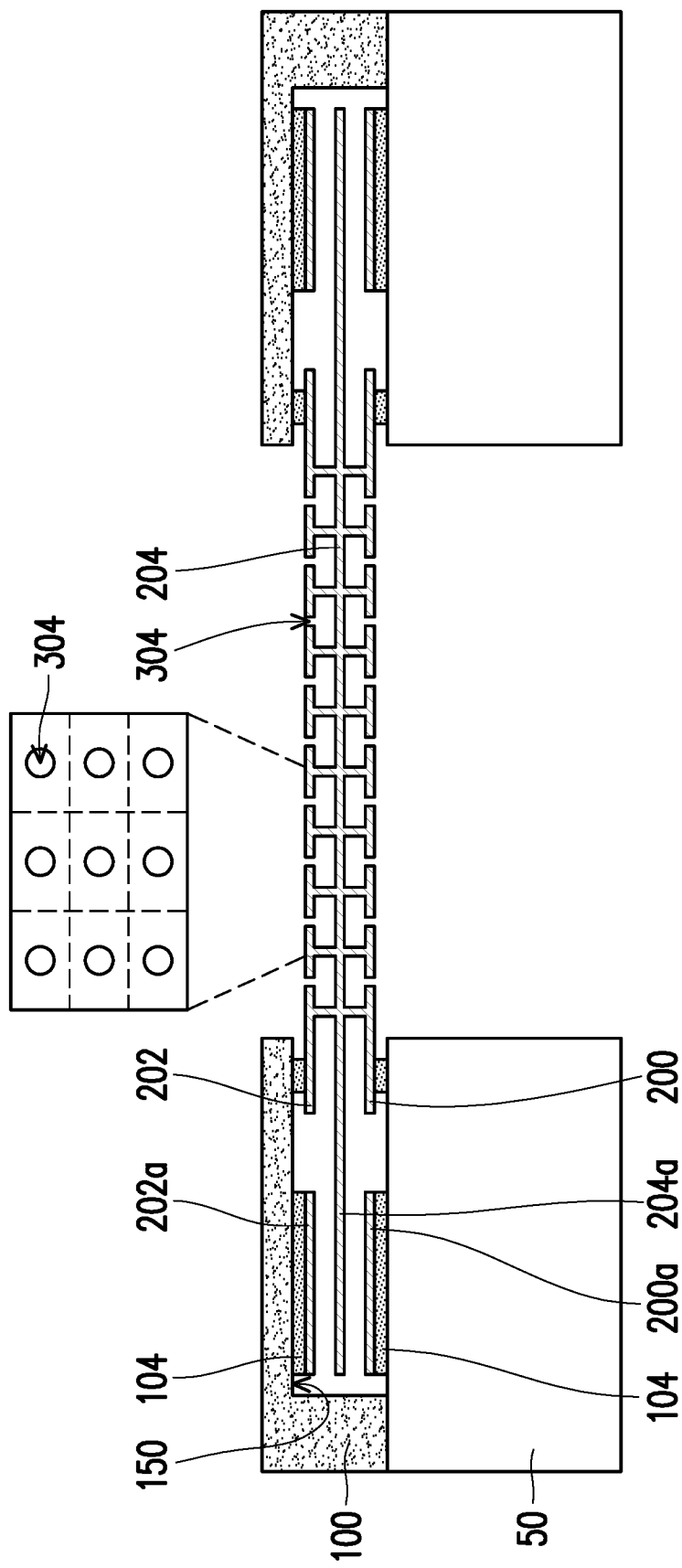
FIG. 10 is a drawing, schematically illustrating a cross-sectional view of the MEMS microphone, according to an embodiment of the invention.

FIG. 10 is a drawing, schematically illustrating a cross-sectional view of the MEMS microphone, according to an embodiment of the invention. Referring to FIG. 10, in another embodiment, the elastic diaphragms 200, 202 may also has etching holes 304. An additional etching process may be performed through the etching holes 304, so that the dielectric materials may be removed. In this situation the holding structure between the two elastic diaphragms 200, 202 is the support walls 208.

Figure 11:
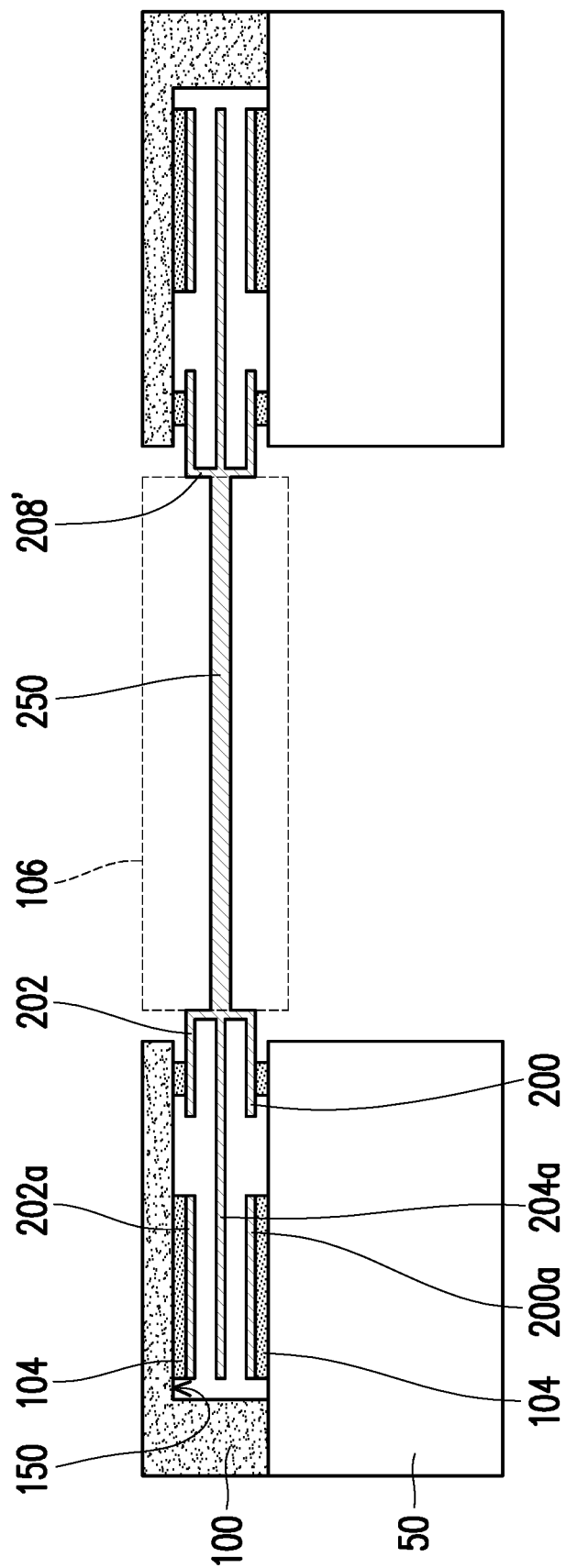
FIG. 11 is a drawing, schematically illustrating a cross-sectional view of the MEMS microphone, according to an embodiment of the invention.

FIG. 11 is a drawing, schematically illustrating a cross-sectional view of the MEMS microphone, according to an embodiment of the invention. Referring to FIG. 11, the sensing diaphragm 106 may include a solid sensing diaphragm 250 at the central part. However, the peripheral parts of the elastic diaphragms 200, 202 as described in the foregoing embodiments still remain. The elastic effect shown in FIG. 7 and FIG. 8 then still remain. In other words, the solid sensing diaphragm 250 may mechanically drive the peripheral part 204a in vibration. The support wall 208' is then a ring as viewed from top to join the elastic diaphragms 200, 202 and also form the hermetic signal sensing space 260. In an embodiment, the hermetic signal sensing space 260 has a pressure less than the ambient pressure. The sensing capacitor is actually formed in the hermetic signal sensing space 260 with reduced effect form the air flow, in an example.

Figure 12A:
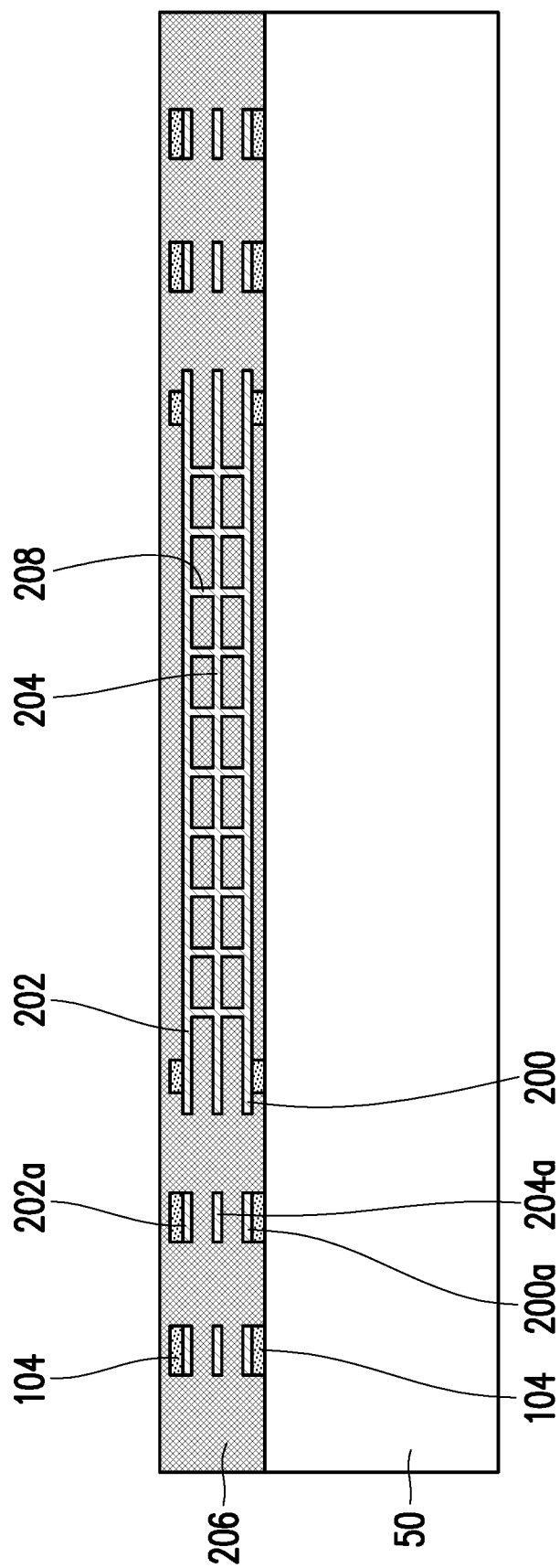
FIG. 12A to FIG. 12J are drawings, schematically illustrating cross-sectional views of a MEMS microphone in fabrication flow, according to an embodiment of the invention.

FIG. 12A to FIG. 12J are drawings, schematically illustrating cross-sectional views of a MEMS microphone in fabrication flow, according to an embodiment of the invention. Referring to FIG. 12A, a dielectric layer 206 is formed on the substrate 50. The structure of the sensing diaphragm has been formed and embedded in the dielectric layer 206. As the foregoing descriptions, the sensing diaphragm includes two elastic diaphragms 200, 202, the conductive plate 204, the holding structure between the two elastic diaphragms 200, 202. The holding structure include a portion of the dielectric layer 206 and the support walls 208. The support layer 104 may also be included to hold the electrode layers 200a, 200b. The electrode layers 200a, 200b may be formed simultaneously while forming the two elastic diaphragms 200, 202 but electric separated.

Figure 12B:
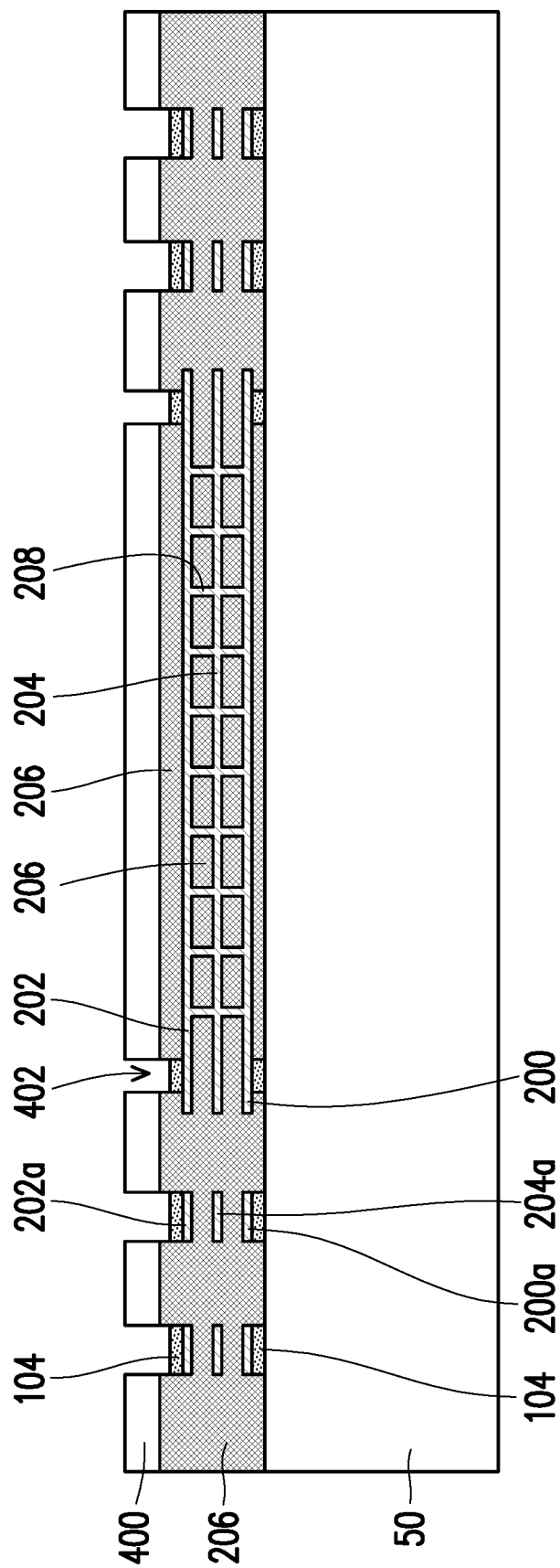

Referring to FIG. 12B, a photoresistive layer 400 with opening 402 is formed on the dielectric layer 206. Then, an etching process is performed to etch the dielectric layer 206, so to expose the support layer 104 at the top part.

Figure 12C:
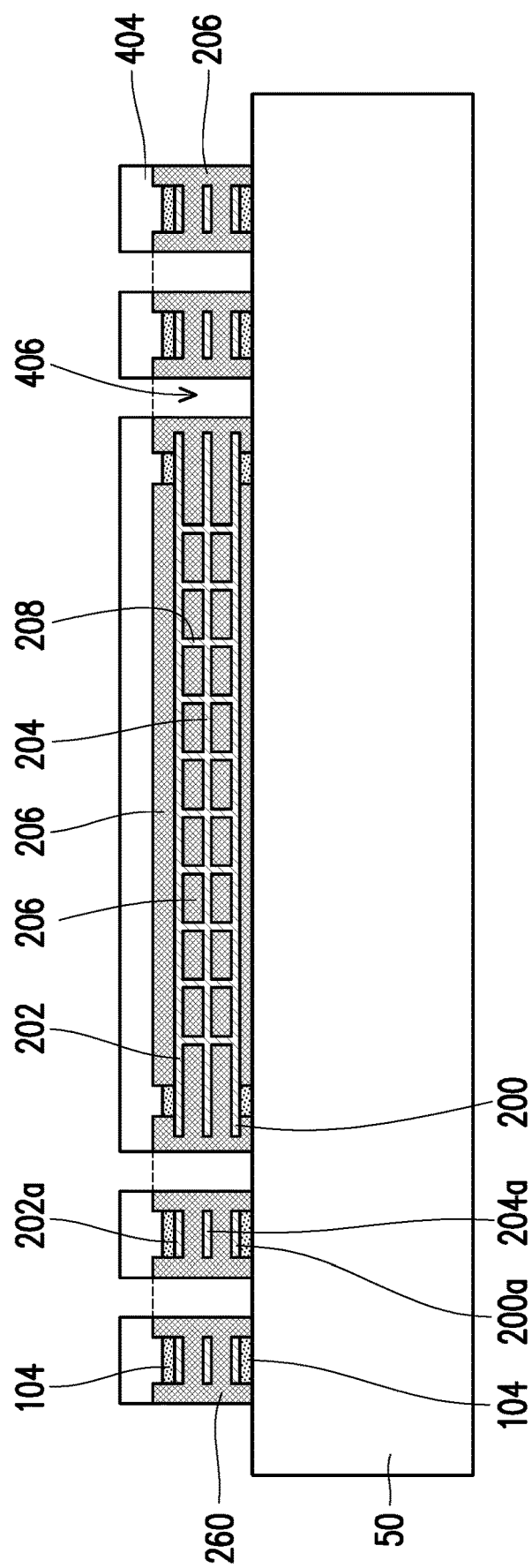

Referring to FIG. 12C, the photoresistive layer 400 is removed and another photoresistive layer 404 is formed on the dielectric layer 206 and the support layer 104. The photoresistive layer 404 has openings to expose the dielectric layer 206. The dielectric layer 206 is then etched to have the openings 406 to expose the substrate 50. The openings 406 is preserved to form the pillars 102 later.

Figure 12D:
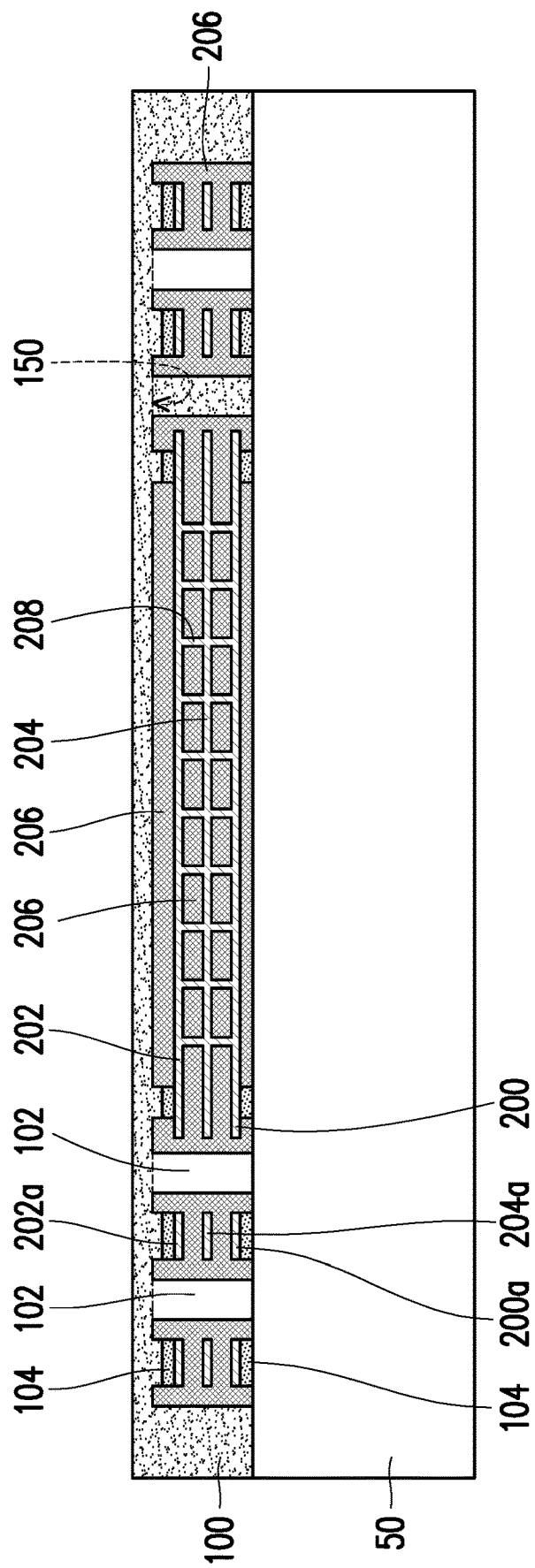

Referring to FIG. 12D, after removing the photoresistive layer 404 another dielectric layer 100 is formed over the dielectric layer 206. The dielectric layer 100 also fills into the openings 406 in FIG. 12C, so to form the pillars 102, which is a part of the dielectric layer 100. From another point of view, the dielectric layer 100 has the indent region 150 at adapt the pillars 102 and the electrode layers 200a, 202a and the support layer 104.

Figure 12E:
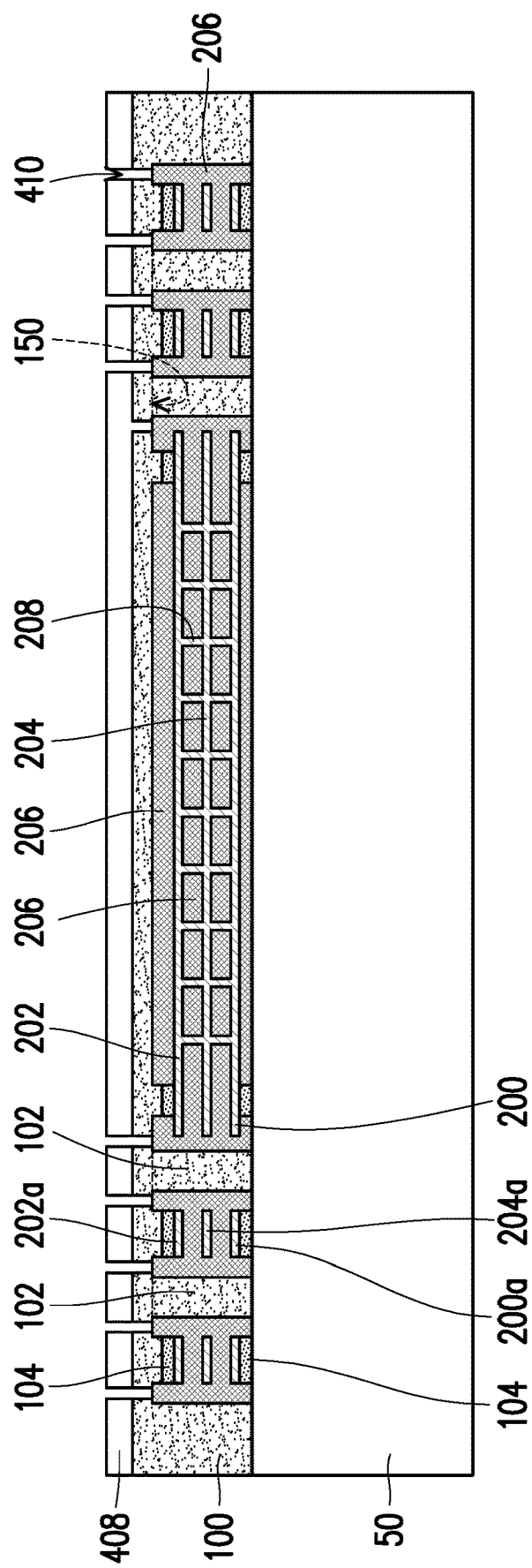

Referring to FIG. 12E, a photoresistive layer 408 with the opening pattern is formed on the dielectric layer 100. The dielectric layer 100 is then etched to have the openings 410 to expose the dielectric layer 206. The material of the dielectric layer 100, such as nitride, may be different from the dielectric layer 206, such as oxide.

Figure 12F:
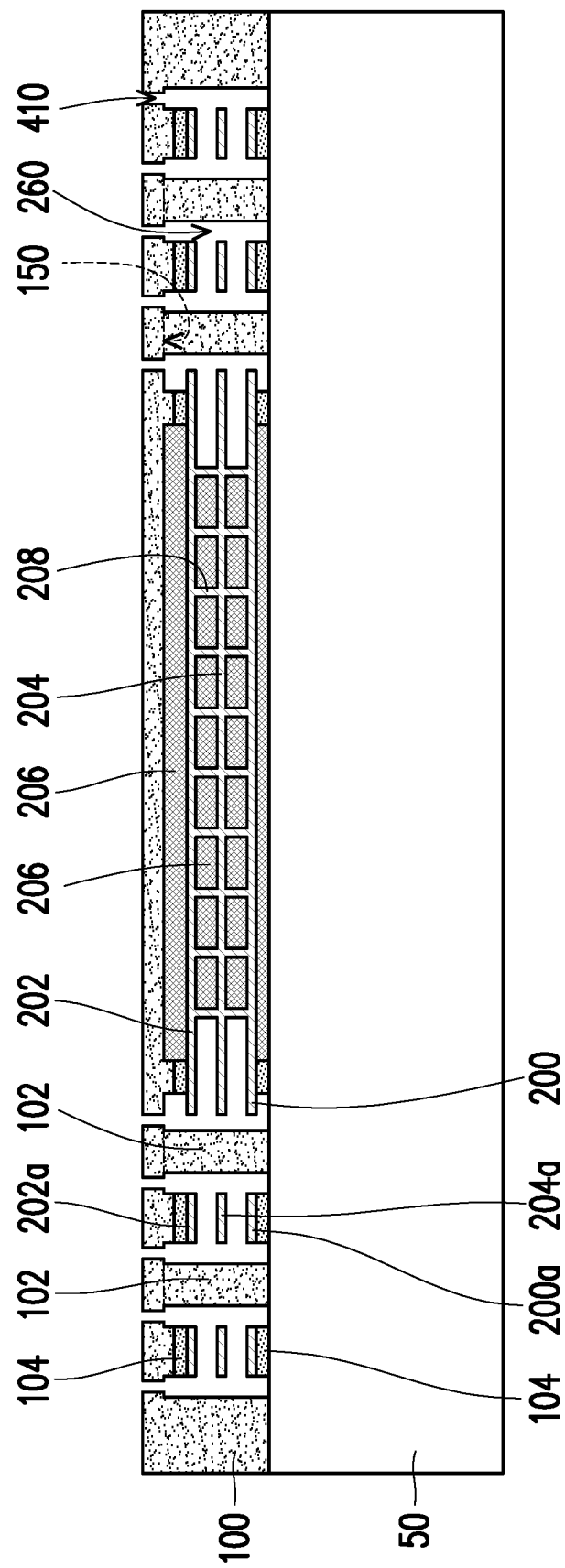

Referring to FIG. 12F, after the photoresistive layer 408 is removed, the dielectric layer 206 is etched away through the openings 410 in the dielectric layer 100. The space occupied by the potion of the dielectric layer 206 as removed is free, serving as the signal sensing space, but not being formed as the hermetic space yet.

Figure 12G:
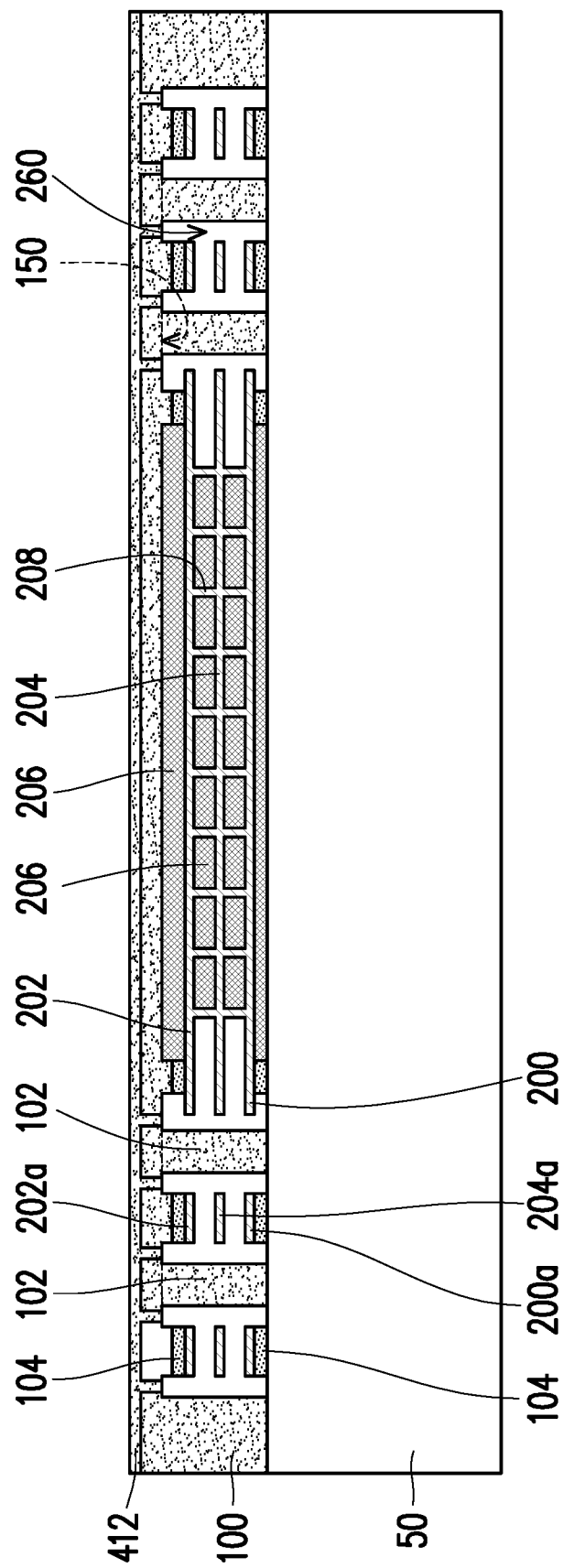

Referring to FIG. 12G, another dielectric layer 412 fills the openings 410, the signal sensing space 260 is formed as a hermetic space. Here in an embodiment, when the hermetic space is formed, a vacuum level is controlled to have a pressure less than the ambient pressure. The dielectric layer 412 is merged with the dielectric layer 100 as a part of the dielectric layer 100 actually.

Figure 12H:
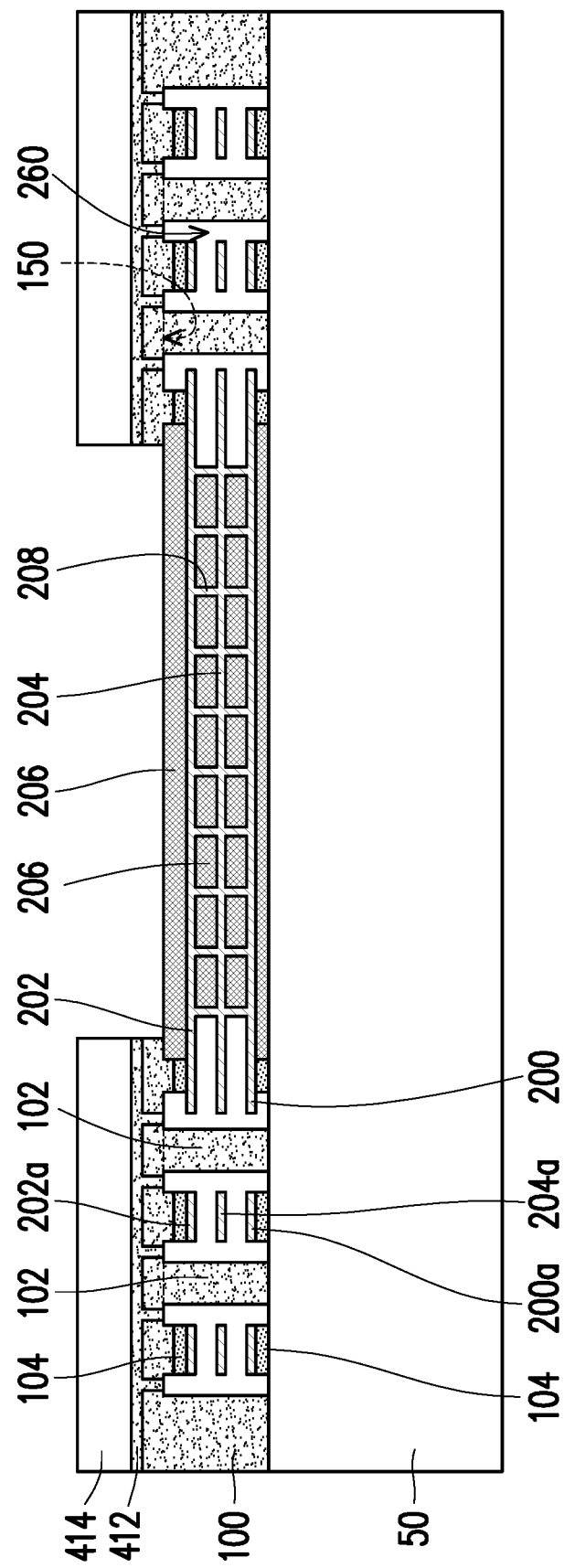

Referring to FIG. 12H, a photoresist layer 414 with the opening pattern is formed on the dielectric layer 412. The opening pattern is corresponding to region of the sensing diaphragm 106 (see FIG. 3) to be released. The dielectric layer 412 and the dielectric layer 100 is etched to expose the dielectric layer 206. In the stage, the dielectric layer 100 with the dielectric layer 412 has an opening at the central part. The indent region 150 is surrounding the opening. The signal sensing space 260 is formed at the indent region 150 of the dielectric layer 100, with the dielectric layer 412 to seal as a hermetic space.

Figure 12I:
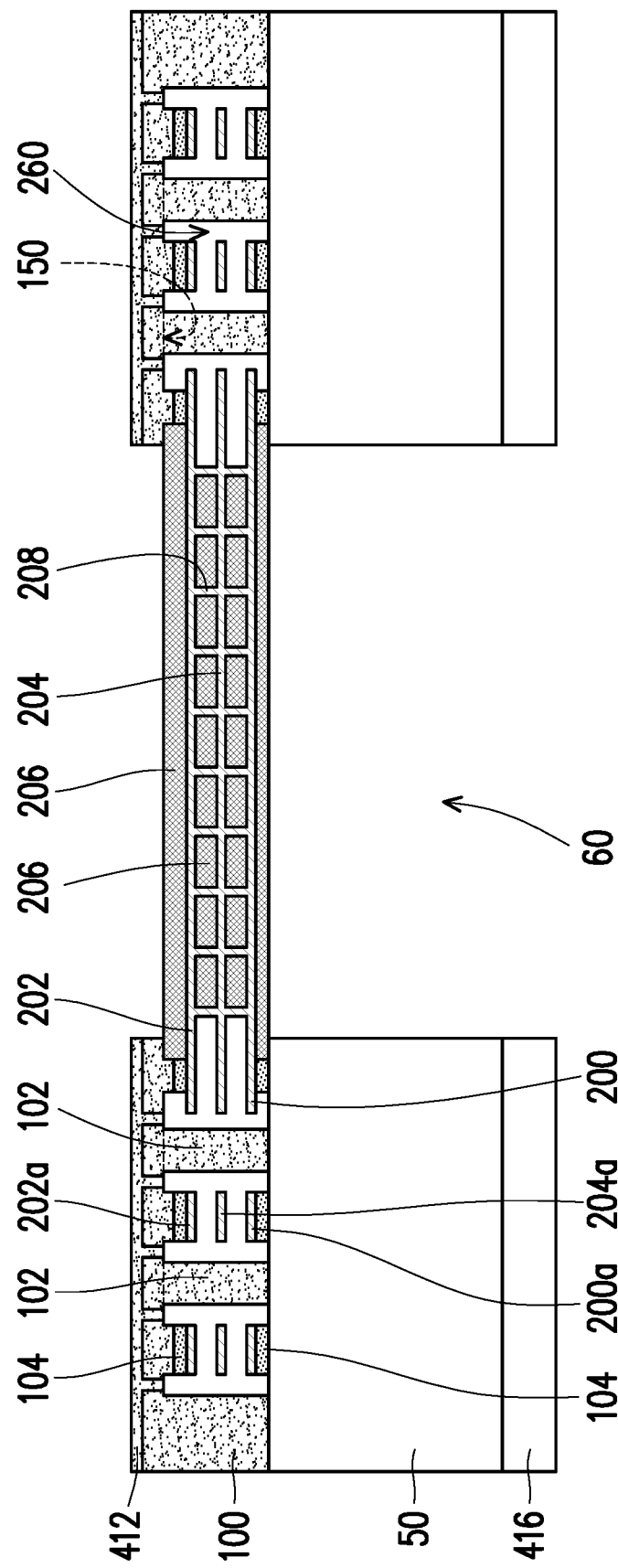

Referring to FIG. 12I, the photoresist layer 414 is removed. Another photoresist layer 416 is with opening pattern is formed on the substrate 50 at the bottom side. Then, the substrate 50 is etched to form the opening 60, in which the dielectric layer 206 at the bottom side is exposed or released by the opening 60.

Figure 12J:
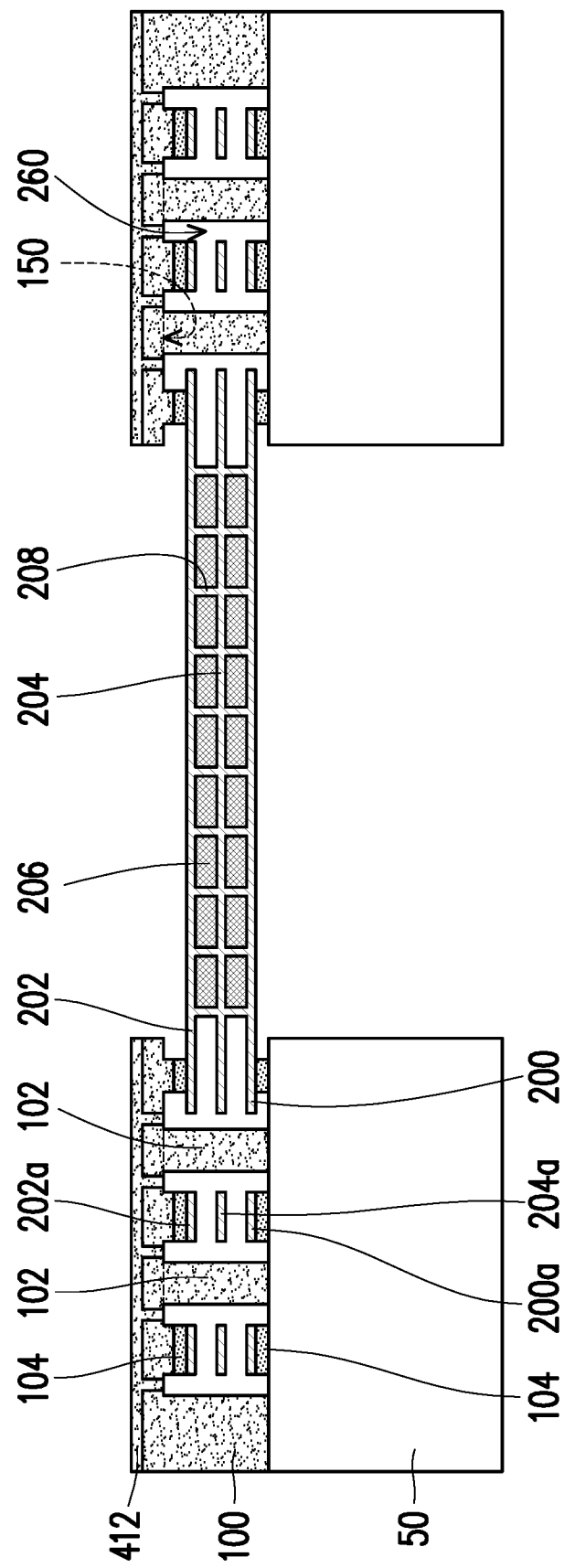

Referring to FIG. 12J, a portion of the dielectric layer 206 out of the elastic diaphragms 200, 202 are removed. The elastic diaphragms 200, 202 are then exposed. In this stage, the sensing diaphragm 106 is released.

Generally, the invention has provided the MEMS microphone without involving the back plate with the venting holes. The sensing diaphragm is directly sensing the acoustic signals. The capacitor a is formed at the indent region 150 of the dielectric layer 100, and then may be not involving the back plate.

As to the foregoing descriptions, in an embodiment, the invention provides a structure of MEMS microphone. The MEMS microphone comprises a substrate of semiconductor, having a first opening in the substrate. A dielectric layer is disposed on the substrate, wherein the dielectric layer has a second opening corresponding to the first opening. The dielectric layer includes an indent region with respect to the substrate, surrounding the second opening. A plurality of pillars is extending from an indent surface at the indent region to the substrate. An outer part is surrounding the indent region and disposed on the substrate. A signal sensing space is created at the indent region between the pillars and between the pillars and the outer part. A first electrode layer is supported on the indent surface of the dielectric layer. A second electrode layer is supported on the substrate. A sensing diaphragm is held by the dielectric layer, comprising a first elastic diaphragm, supported by the dielectric layer at a first side region. A second elastic diaphragm is supported by the substrate at a second side region. A holding structure is between the first elastic diaphragm and the second elastic diaphragm. A conductive plate is between the first elastic diaphragm and the second elastic diaphragm. The conductive plate comprises a central part embedded in the holding structure and a peripheral part extending into the signal sensing space.

In an embodiment, as to the structure of MEMS microphone, it further comprises a first support layer on the indent surface of the dielectric layer to support the first electrode layer and a second support layer on the substrate to support the second electrode layer, wherein the first support layer and the second support layer hold the sensing diaphragm.

In an embodiment, as to the structure of MEMS microphone, the peripheral part of the conductive plate is between the first electrode layer and the second electrode layer to form two capacitors coupled in series.

In an embodiment, as to the structure of MEMS microphone, the holding structure between the first elastic diaphragm and the second elastic diaphragm comprises a dielectric part between the first elastic diaphragm and the conductive plate and between the second elastic diaphragm and the conductive plate. A plurality of supporting walls in the dielectric part is between the first elastic diaphragm and the conductive plate and between the second elastic diaphragm and the conductive plate.

In an embodiment, as to the structure of MEMS microphone, the holding structure between the first elastic diaphragm and the second elastic diaphragm comprises a plurality of supporting walls to support between the first elastic diaphragm and the conductive plate and between the second elastic diaphragm and the conductive plate. The first elastic diaphragm and the second elastic diaphragm comprises a plurality of holes, a side of the supporting walls is exposed.

In an embodiment, as to the structure of MEMS microphone, the pillars are distributed to surround the second opening of the dielectric layer.

In an embodiment, as to the structure of MEMS microphone, it further comprises an anti-stiction protruding on at least one of the first electrode layer, the second electrode layer and the conductive plate within the signal sensing space.

In an embodiment, as to the structure of MEMS microphone, the sensing diaphragm comprises a through hole in connection to the first opening in the substrate.

In an embodiment, as to the structure of MEMS microphone, a peripheral part of the first elastic diaphragm and the second elastic diaphragm held by the dielectric layer is an elastic part to have a bending shift when the central part as a hard part receives an air acoustic pressure.

In an embodiment, the invention also provides structure of MEMS microphone. The MEMS microphone comprises a substrate of semiconductor, having a first opening in the substrate. A dielectric layer is disposed on the substrate. The dielectric layer has a second opening corresponding to the first opening. The dielectric layer includes an indent region with respect to the substrate, surrounding the second opening. A plurality of pillars is extending from an indent surface at the indent region to the substrate. An outer part is surrounding the indent region and disposed on the substrate. A signal sensing space is created at the indent region between the pillars and between the pillars and the outer part. A first electrode layer is supported on the indent surface of the dielectric layer. A second electrode layer is supported on the substrate. A sensing diaphragm is held by the dielectric layer, comprising a first elastic ring layer, supported by the dielectric layer at a first side region. A second elastic ring layer is supported by the substrate at a second side region. A vertical ring is joining the first elastic ring diaphragm and the second elastic ring diaphragm at an inner side. A conductive plate is affixed to the sidewall, disposing between the first elastic diaphragm and the second elastic diaphragm, and extending into the signal sensing space. A hard diaphragm is affixed to the side wall within the vertical ring. The conductive plate shifts together with the hard diaphragm are affixed as a whole to shift together.

In an embodiment, as to the structure of MEMS microphone, it further comprises first support layer on the indent surface of the dielectric layer to support the first electrode layer and a second support layer on the substrate to support the second electrode layer, wherein the first support layer and the second support layer hold the sensing diaphragm.

In an embodiment, as to the structure of MEMS microphone, the conductive plate is between the first electrode layer and the second electrode layer to form two capacitors coupled in series.

In an embodiment, as to the structure of MEMS microphone, the first elastic ring layer and the second elastic ring layer is an elastic part and is bent when the hard diaphragm shifts up and down.

In an embodiment, as to the structure of MEMS microphone, the pillars are distributed to surround the second opening of the dielectric layer.

In an embodiment, as to the structure of MEMS microphone, it further comprises an anti-stiction protruding on at least one of the first electrode layer, the second electrode layer and the conductive plate within the signal sensing space.

In an embodiment, as to the structure of MEMS microphone, the hard diaphragm comprises metal.

In an embodiment, as to the structure of MEMS microphone, the sensing diaphragm comprises a through hole in connection to the first opening in the substrate.

In an embodiment, as to the structure of MEMS microphone, the first elastic ring layer and the second elastic ring layer held by the dielectric layer is an elastic structure to have a bending shift when the hard diaphragm receives an air acoustic pressure.

In an embodiment, the invention also provides structure of MEMS microphone. The MEMS microphone comprises a substrate of semiconductor, having a first opening in the substrate. A dielectric layer disposed on the substrate, wherein the dielectric layer has a second opening corresponding to the first opening, the dielectric layer includes an indent region with respect to the substrate, surrounding the second opening. A first electrode layer is supported on the indent surface of the dielectric layer. A second electrode layer is supported on the substrate. A sensing diaphragm held by the dielectric layer comprises an elastic portion held between the dielectric layer at the indent region and the substrate. A central hard region receives an air acoustic pressure and according shifts in responing to the acoustic pressure. An electrode portion is affixed to the central hard region and extending into the signal sensing space between the first electrode layer and the second electrode layer. The electrode portion and the central hard region shift together.

In an embodiment, as to the structure of MEMS microphone, it further comprises a first support layer on the indent surface of the dielectric layer to support the first electrode layer and a second support layer on the substrate to support the second electrode layer, wherein the first support layer and the second support layer hold the sensing diaphragm.

In an embodiment, as to the structure of MEMS microphone, the electrode portion of the sensing diaphragm is between the first electrode layer and the second electrode layer to form two capacitors coupled in series.

In an embodiment, as to the structure of MEMS microphone, the dielectric layer also includes: a plurality of pillars, extending from an indent surface at the indent region to the substrate; and an outer part, surrounding the indent region and disposed on the substrate, wherein a signal sensing space is created at the indent region between the pillars and between the pillars and the outer part.

In an embodiment, as to the structure of MEMS microphone, the pillars are distributed to surround the second opening of the dielectric layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of micro-electro-mechanical-system (MEMS) microphone, comprising:

a substrate of semiconductor, having a first opening in the substrate;
a dielectric layer disposed on the substrate, wherein the dielectric layer has a second opening corresponding to the first opening, the dielectric layer includes:
an indent region with respect to the substrate, surrounding the second opening;
a plurality of pillars, extending from an indent surface at the indent region to the substrate; and
an outer part, surrounding the indent region and disposed on the substrate, wherein a signal sensing space is created at the indent region between the pillars and between the pillars and the outer part;
a first electrode layer supported on the indent surface of the dielectric layer;
a second electrode layer supported on the substrate;
a sensing diaphragm, held by the dielectric layer, comprising:
a first elastic diaphragm, supported by the dielectric layer at a first side region;
a second elastic diaphragm, supported by the substrate at a second side region;
a holding structure between the first elastic diaphragm and the second elastic diaphragm;
a conductive plate between the first elastic diaphragm and the second elastic diaphragm, wherein the conductive plate comprises:
a central part embedded in the holding structure; and
a peripheral part extending into the signal sensing space.

2. The structure of MEMS microphone as recited in claim 1, further comprising a first support layer on the indent surface of the dielectric layer to support the first electrode layer and a second support layer on the substrate to support the second electrode layer, wherein the first support layer and the second support layer hold the sensing diaphragm.

3. The structure of MEMS microphone as recited in claim 1, wherein the peripheral part of the conductive plate is between the first electrode layer and the second electrode layer to form two capacitors coupled in series.

4. The structure of MEMS microphone as recited in claim 1, wherein the holding structure between the first elastic diaphragm and the second elastic diaphragm comprises:
a dielectric part between the first elastic diaphragm and the conductive plate and between the second elastic diaphragm and the conductive plate;
a plurality of supporting walls in the dielectric part, between the first elastic diaphragm and the conductive plate and between the second elastic diaphragm and the conductive plate.

5. The structure of MEMS microphone as recited in claim 1, wherein the holding structure between the first elastic diaphragm and the second elastic diaphragm comprises:
a plurality of supporting walls to support between the first elastic diaphragm and the conductive plate and between the second elastic diaphragm and the conductive plate, wherein the first elastic diaphragm and the second elastic diaphragm comprises a plurality of holes, a side of the supporting walls is exposed.

6. The structure of MEMS microphone as recited in claim 1, wherein the pillars are distributed to surround the second opening of the dielectric layer.

7. The structure of MEMS microphone as recited in claim 1, wherein further comprising an anti-stiction protruding on at least one of the first electrode layer, the second electrode layer and the conductive plate within the signal sensing space.

8. The structure of MEMS microphone as recited in claim 1, wherein the sensing diaphragm comprises a through hole in connection to the first opening in the substrate.

9. The structure of MEMS microphone as recited in claim 1, wherein a peripheral part of the first elastic diaphragm and the second elastic diaphragm held by the dielectric layer is an elastic part to have a bending shift when the central part as a hard part receives an air acoustic pressure.

10. The structure of MEMS microphone as recited in claim 1, wherein the signal sensing space is hermetic with a pressure less than an ambient pressure.

11. A structure of micro-electro-mechanical-system (MEMS) microphone, comprising:
a substrate of semiconductor, having a first opening in the substrate;
a dielectric layer disposed on the substrate, wherein the dielectric layer has a second opening corresponding to the first opening, the dielectric layer includes:
an indent region with respect to the substrate, surrounding the second opening;
a plurality of pillars, extending from an indent surface at the indent region to the substrate; and
an outer part, surrounding the indent region and disposed on the substrate, wherein a signal sensing space is created at the indent region between the pillars and between the pillars and the outer part;
a first electrode layer supported on the indent surface of the dielectric layer;
a second electrode layer supported on the substrate;
a sensing diaphragm, held by the dielectric layer, comprising:
a first elastic ring layer, supported by the dielectric layer at a first side region;
a second elastic ring layer, supported by the substrate at a second side region;
a vertical ring, joining the first elastic ring diaphragm and the second elastic ring diaphragm at an inner side;
a conductive plate, affixed to the sidewall, disposing between the first elastic diaphragm and the second elastic diaphragm, and extending into the signal sensing space; and
a hard diaphragm affixed to the side wall within the vertical ring,
wherein the conductive plate shifts together with the hard diaphragm are affixed as a whole to shift together.

12. The structure of MEMS microphone as recited in claim 11, further comprising a first support layer on the indent surface of the dielectric layer to support the first electrode layer and a second support layer on the substrate to support the second electrode layer, wherein the first support layer and the second support layer hold the sensing diaphragm.

13. The structure of MEMS microphone as recited in claim 11, wherein the conductive plate is between the first electrode layer and the second electrode layer to form two capacitors coupled in series.

14. The structure of MEMS microphone as recited in claim 11, wherein the first elastic ring layer and the second elastic ring layer is an elastic part and is bent when the hard diaphragm shifts up and down.

15. The structure of MEMS microphone as recited in claim 11, wherein the pillars are distributed to surround the second opening of the dielectric layer.

16. The structure of MEMS microphone as recited in claim 11, wherein further comprising an anti-stiction protruding on at least one of the first electrode layer, the second electrode layer and the conductive plate within the signal sensing space.

17. The structure of MEMS microphone as recited in claim 11, wherein the hard diaphragm comprises metal.

18. The structure of MEMS microphone as recited in claim 11, wherein the sensing diaphragm comprises a through hole in connection to the first opening in the substrate.

19. The structure of MEMS microphone as recited in claim 11, wherein the first elastic ring layer and the second elastic ring layer held by the dielectric layer is an elastic structure to have a bending shift when the hard diaphragm receives an air acoustic pressure.

20. The structure of MEMS microphone as recited in claim 11, wherein the signal sensing space is hermetic with a pressure less than an ambient pressure.

21. A structure of micro-electro-mechanical-system (MEMS) microphone, comprising:
  a substrate of semiconductor, having a first opening in the substrate;
  a dielectric layer disposed on the substrate, wherein the dielectric layer has a second opening corresponding to the first opening, the dielectric layer includes an indent region with respect to the substrate, surrounding the second opening;
  a first electrode layer supported on the indent surface of the dielectric layer;
  a second electrode layer supported on the substrate;
  a sensing diaphragm, held by the dielectric layer, comprising:
    an elastic portion held between the dielectric layer at the indent region and the substrate;
    a central hard region to receives an air acoustic pressure and according shift in responding to the acoustic pressure; and
    an electrode portion, affixed to the central hard region and extending nto the signal sensing space between the first electrode layer and the second electrode layer, wherein the electrode portion and the central hard region shift together.

22. The structure of MEMS microphone as recited in claim 21, further comprising a first support layer on the indent surface of the dielectric layer to support the first electrode layer and a second support layer on the substrate to support the second electrode layer, wherein the first support layer and the second support layer hold the sensing diaphragm.

23. The structure of MEMS microphone as recited in claim 21, wherein the electrode portion of the sensing diaphragm is between the first electrode layer and the second electrode layer to form two capacitors coupled in series.

24. The structure of MEMS microphone as recited in claim 21, wherein the dielectric layer also includes:
  a plurality of pillars, extending from an indent surface at the indent region to the substrate; and
  an outer part, surrounding the indent region and disposed on the substrate, wherein a signal sensing space is created at the indent region between the pillars and between the pillars and the outer part.

25. The structure of MEMS microphone as recited in claim 24, wherein the pillars are distributed to surround the second opening of the dielectric layer.

26. The structure of MEMS microphone as recited in claim 21, wherein the signal sensing space is hermetic with a pressure less than an ambient pressure.

* * * * *